United States Patent [19]

Doyle

[11] Patent Number: 5,031,152
[45] Date of Patent: Jul. 9, 1991

[54] TEST CIRCUIT FOR NON-VOLATILE STORAGE CELL

[75] Inventor: Bruce A. Doyle, Flower Mound, Tex.

[73] Assignee: SGS-Thomson Microelectronics, Inc., Carrollton, Tex.

[21] Appl. No.: 414,775

[22] Filed: Sep. 29, 1989

[51] Int. Cl.⁵ .................. G11C 7/00; G11C 29/00
[52] U.S. Cl. .................... 365/201; 365/185; 371/21.1
[58] Field of Search ............ 365/201, 185; 371/21.1, 371/21.2, 22.3, 22.5

[56] References Cited

U.S. PATENT DOCUMENTS 4,803,659 2/1989 Hallenbeck .................. 365/104
4,862,418 8/1988 Cuppens et al. .................. 365/201

Primary Examiner—Joseph A. Popek
Assistant Examiner—Michael A. Whitfield
Attorney, Agent, or Firm—Kenneth C. Hill; Richard K. Robinson

[57] ABSTRACT

A latch is provided in association with each non-volatile memory element used to store configuration information on a programmable logic device. In normal use, configuration information is written to the non-volatile memory elements in the usual manner. However, during testing volatile memory elements in the usual manner. However, during testing configuration information is written only to the latches associated with the non-volatile elements. The latches place the data stored therein onto the same architecture bit line used by the non-volatile memory elements, allowing chip configuration testing to be performed without actually writing to the non-volatile memory elements. The latches can be written to at a much faster speed than the non-volatile memory elements can be programmed, greatly decreasing the time needed for full testing of the programmable logic device.

6 Claims, 1 Drawing Sheet

TEST CIRCUIT FOR NON-VOLATILE STORAGE CELL

BACKGROUND OF THE INVENTION

1. Field of the Invention

The present invention is related generally to integrated circuits, and more specifically to circuits included on integrated circuit devices for testing purposes.

2. Description of the Prior Art

It is usually desirable to increase the number of logical functions performed on a single integrated circuit chip. This allows for the replacement of several integrated circuit devices by a single device, thereby decreasing system cost. Other benefits also accrue, typically including lower system power consumption and improved performance.

Custom chip design is relatively expensive, and design changes are often difficult. Of increasing popularity within the electronics industry has been the use of integrated circuit chips which are programmable by the system designer or end user. These devices are referred to generally as programmable logic devices (PLDs). With these devices, the user can tailor operation of a general purpose commodity device to his specific needs.

One common type of PLD includes an AND-OR array. This array is programmed to provide desired logic functions. Programmable input and output buffers are also provided on many such devices. A programmable logic device is configured by writing data into architecture bits, also known as configuration bits, on the chip. These bits are used to select from various functions which are available on the device.

Configuration bits can be used, for example, to define a pin on an integrated circuit chip as an output pin or an input pin. An input or output pin can be defined as active high or active low. In general, the configuration bits are used to program the behavior of the programmable logic device. These bits are stored on the chip in non-volatile memory. Since the configuration information is written into non-volatile memory, it can be written to the chip by the user, and the chip will retain its desired configuration.

The configuration bits allow the programmable logic device to be programmed to operate in any of several configurations. Chip manufacturers prefer to test all possible configurations to ensure proper chip function before shipping the completed devices to users and resellers. This means that, during testing, the configuration bits must be reprogrammed for each possible configuration. Typically, all configuration bits must be cleared prior to programming a new configuration to be tested.

The configuration information is typically stored in EEPROM, although EPROMs and PROMs are also used. With EEPROMs, clear and program times are typically on the order of a few milliseconds. This means that, for example, 30-50 ms would be needed just to reprogram the configuration bits on a device having 9 or 10 different configurations.

The delay inherent in programming the configuration bits adds greatly to the total time required for chip testing. This adds to the overall cost of the programmable logic device. If it is necessary to minimize cost and tester time, it is sometimes necessary to test only a few of the possible configurations of each device.

It would be desirable to provide a mechanism which minimized test time while still allowing full testability of all device configurations. It is also desirable that such a mechanism does not adversely effect normal configuration programming and operation of the device.

SUMMARY OF THE INVENTION

It is therefor an object of the present invention to provide a circuit for use with configuration bit storage on programmable logic devices which greatly decreases the testing time thereof.

It is a further object of the present invention to provide such a circuit which is usable with different types of non-volatile memory cells.

It is another object of the present invention to provide such a circuit which is simple and requires only a small amount of layout area on an integrated circuit chip.

It is yet another object of the present invention to provide such a circuit which does not interfere with normal operation and programming of the device.

Therefore, according to the present invention, a latch is provided in association with each non-volatile memory element used to store configuration information on a programmable logic device. In normal use, configuration information is written to the non-volatile memory elements in the usual manner. However, during testing configuration information is written only to the latches associated with the non-volatile memory elements. The latches place the data stored therein onto the same architecture bit line used by the non-volatile memory elements, allowing chip configuration testing to be performed without actually writing to the non-volatile memory elements. The latches can be written to at a much faster speed than the non-volatile memory elements can be programmed, greatly decreasing the time needed for full testing of the programmable logic device.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
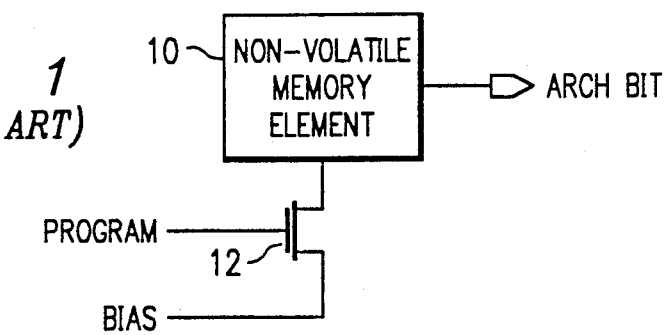
FIG. 1 is a block diagram illustrating operation of a prior art non-volatile memory element used for storing configuration information in a programmable logic device.

FIG. 1 illustrates a prior art circuit typically used in various kinds of programmable logic devices. The circuit includes a non-volatile memory element 10, which is typically an EEPROM. Other types of non-volatile memory, such as EPROMs and PROMs are also suitable for use with the present invention. The memory element 10 is programmed in a known manner through the use of field effect transistor 12. When the memory element 10 is programmed, a voltage corresponding to a logical 0 or logical 1 is applied to the signal BIAS. The signal PROGRAM is raised to turn on the transistor 12 and transfer the value of BIAS into the memory element 10.

The value stored in the non-volatile memory element 10 is available to the remainder of the circuitry on the device as the signal ARCH BIT. This signal is used by the remainder of the circuitry to determine operation of programmable portions of the device, being used for example, at the control inputs of multiplexers. Since the memory element 10 is non-volatile, the value stored therein remains until it is reprogrammed.

Many device architectures require that all non-volatile memory elements on the chip be first cleared, and then programmed. This requires two program cycles to complete. Since each memory element 10 must be cleared and programmed for each different configuration which must be tested, the time required for reconfiguring the device is quite long. In many instances, the time required to configure the device by programming the non-volatile memory elements 10 can be 50% or more of the total testing time.

Figure 2:
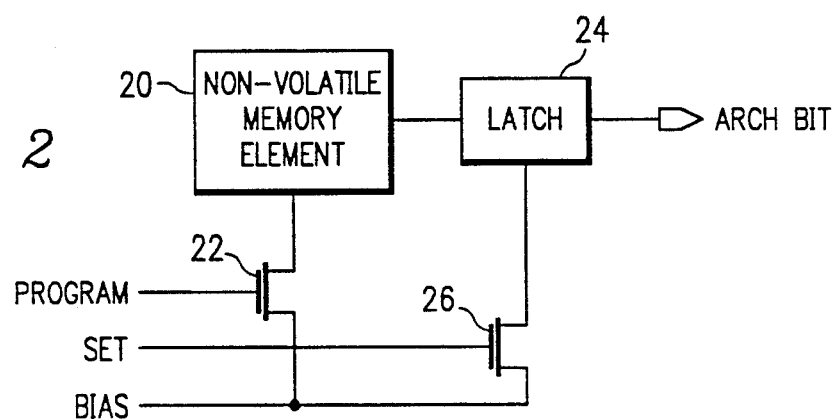
FIG. 2 is a block diagram of a single bit non-volatile memory element used for storing configuration information according to the present invention.

Referring to FIG. 2, a circuit for decreasing the test time of programmable logic devices is shown. A non-volatile memory element 20 is programmed by the proper application of signals to programming transistor 22 as described in connection with FIG. 1. The PROGRAM signal is used to apply the value of the BIAS signal to the non-volatile memory element 20 by turning on transistor 22.

A latch 24 is connected to the non-volatile memory element 20, and to a transistor switch 26. Transistor 26 is switched on or off according to the value of the signal SET, and connects the value of the signal BIAS to the latch 24.

Latch 24 is used only during testing of the programmable logic device. During testing, the value stored in the latch 24 provides the signal ARCH BIT. During normal programming and operation of the device, the value stored in non-volatile memory element 20 defines the signal ARCH BIT, and the latch 24 has no effect.

Latch 24 is a volatile device, and data can be stored thereon at much faster speeds than is possible for the memory element 20. Using current technology, data may be written to latch 24 in approximately 10-20 nanoseconds, while memory element 20 typically requires a write time of 1-2 milliseconds. This reduces the overall testing time of the device dramatically, while still providing complete testing of all possible configurations.

Figure 3:
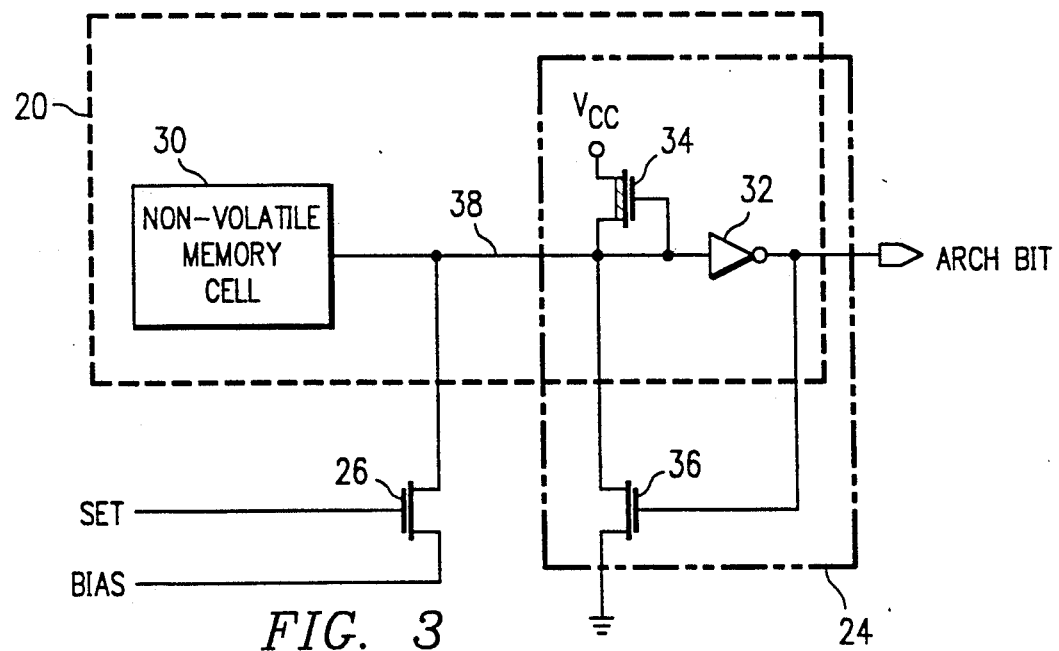
FIG. 3 is a schematic diagram showing details of a preferred embodiment of the circuitry illustrated in FIG. 2.

The latch 24 may be designed in any of a number of different ways, and a preferred embodiment is shown in FIG. 3. The non-volatile memory element 20 contains a non-volatile memory cell 30 as known in the art. Memory element 20 includes an output stage containing an inverter 32 and a pull-up transistor 34. Transistor 34 is preferably a depletion mode device connected as shown in order to provide a resistive load. The output of inverter 32 provides the signal ARCH BIT.

The addition of feedback transistor 36 to the output stage of memory element 20 forms the latch 24. The gate of transistor 36 is connected to the output of the inverter 32, and transistor 36 acts as a switch between node 38 and ground. Programming transistor 26 is also connected to node 38, and couples the voltage of BIAS thereto when the signal SET is high.

During testing, if BIAS is 0 volts and set is high, node 38 is at ground potential. This causes the output of inverter 32 to be high, turning on transistor 36 and connecting node 38 to ground through transistor 36. Even after transistor 26 is turned off, node 38 is held at ground potential through transistor 36.

If BIAS is at a high voltage during testing, and set is high, node 38 is also high. This drives the output of inverter 32 to ground potential, turning off transistor 36. When transistor 26 is turned off after the test cycle is completed, node 38 will remain at voltage $V_{cc}$ (high). Thus, it is seen that the BIAS voltage applied to node 38 remains stored in the latch defined by transistors 34, 36, and inverter 32.

When testing the programmable logic device, the non-volatile memory cell 30 should be set to a state which does not affect the voltage on node 38. Memory cell 30 is programmed off, which is reflected as a logical 0 on ARCH BIT. If the voltage on node 38 is driven low by the signal BIAS during test programming, it will stay low as described above because transistor 36 will be ON.

During normal operation, the voltage on node 38 is determined by the value stored in non-volatile memory cell 30. This value is inverted in inverter 32 and available as the signal ARCH BIT. Since transistor 36, in concert with load transistor 34, acts as an inverter, transistor 36 has no effect on the normal operation of memory cell 20.

The embodiment described in FIG. 3 adds only two transistors to the circuitry normally required. These are the feedback transistor 36 and the test programming transistor 26. This small space penalty allows extremely fast testing of the programmable logic device, which greatly reduces testing time. The latch 24 may be implemented using other circuitry, as will become apparent to those skilled in the art. The design of the latch 24 will be, in part, dictated by the design of the non-volatile memory cell 30. The only requirement for such latch 24 is that its value determines the value of ARCH BIT during testing, and that it has no effect on normal operation of the device.

While the invention has been particularly shown and described with reference to a preferred embodiment, it will be understood by those skilled in the art that various changes in form and detail may be made therein without departing from the spirit and scope of the invention.

What is claimed is:

1. A storage element for a semiconductor integrated circuit, comprising:
    a non-volatile memory storage cell;
    an output latch coupled to an output of said non-volatile memory storage cell; and
    means for setting a value for said latch during testing, wherein a value output from said output latch is determined by the value set for said latch during testing, and wherein the value output from said latch is determined by a value of said non-volatile memory storage cell otherwise.

2. The device of claim 1, wherein said latch value setting means comprises a transistor switch connected to said latch and to a programmed bit value, said switch being controlled by a test programming signal.

3. A test circuit for use in an integrated circuit device, comprising:
    a non-volatile memory element;

an output signal line coupled to said non-volatile memory element;

a latch coupled to said output signal line; and means for setting a value for said latch during testing, wherein a value of said output signal line is determined by the latch value during testing, and wherein the output signal line value is determined by a value of said non-volatile memory element except during testing, said latch setting means including a transistor switch connected to said latch and to a programmed bit value, said switch being controlled by a test programming signal;

wherein the programmed bit value is also coupled to said non-volatile memory element, wherein said non-volatile device is programmed during a normal programming by the programmed bit value.

4. The device of claim 3, wherein the programmed bit value is coupled to said non-volatile memory element through a second transistor switch, said second switch being controlled by a normal programming signal.

5. A storage element for a semiconductor integrated circuit, comprising:

a non-volatile memory storage cell;

an output signal line;

an output stage having an inverter and a pullup load element at an input to the inverter, wherein the inverter input is connected to an output of the non-volatile memory storage cell, and an output of the inverter is connected to the output signal line; and a transistor switch connected between the inverter input and ground, and having a control input connected to the inverter output.

6. The storage element of claim 5, further comprising:

a transistor switch connected to the inverter input and to a programmed bit value, said switch being controlled by a test programming signal, wherein the test programming signal sets the value of the inverter during testing, and the output from the non-volatile memory storage cell sets the value of the inverter otherwise.

* * * * *